(12) United States Patent
Chen et al.

(10) Patent No.: US 11,467,430 B2
(45) Date of Patent: Oct. 11, 2022

(54) LIGHT SOURCE DEVICE WITH SAFETY MECHANISM AND WAVELENGTH CONVERTING DEVICE THEREOF

(71) Applicant: Taiwan color optics, Inc., Taichung (TW)

(72) Inventors: Hsin-An Chen, Changhua County (TW); Shih-Hsin Chang, Taipei (TW)

(73) Assignee: TAIWAN COLOR OPTICS, INC., Taichung (TW)

( * ) Notice: Subject to any disclaimer, the term of this patent is extended or adjusted under 35 U.S.C. 154(b) by 379 days.

(21) Appl. No.: 16/800,096

(22) Filed: Feb. 25, 2020

(65) Prior Publication Data

US 2020/0271959 A1 Aug. 27, 2020

(30) Foreign Application Priority Data

Feb. 27, 2019 (TW) .................................. 108106779

(51) Int. Cl.
| | |
|---|---|
| *H01S 3/00* | (2006.01) |
| *H01S 5/068* | (2006.01) |
| *G01J 1/42* | (2006.01) |
| *F21S 41/16* | (2018.01) |
| *G02C 7/16* | (2006.01) |
| *G02B 5/02* | (2006.01) |
| *G02F 1/35* | (2006.01) |

(52) U.S. Cl.
CPC ............. *G02C 7/16* (2013.01); *G02B 5/0242* (2013.01); *H01S 3/0014* (2013.01); *H01S 5/06825* (2013.01); *F21S 41/16* (2018.01); *G01J 1/4257* (2013.01); *G02F 1/353* (2013.01)

(58) Field of Classification Search
CPC .... H01S 3/0014; H01S 5/06825; F21S 41/16; G01J 1/4257
See application file for complete search history.

(56) References Cited

U.S. PATENT DOCUMENTS

2016/0290856 A1* 10/2016 Fiederling ............. G01J 1/4228

FOREIGN PATENT DOCUMENTS

| TW | 201243218 A1 | 11/2012 |
| TW | 201431223 A | 8/2014 |

* cited by examiner

*Primary Examiner* — Angela K Davison
(74) *Attorney, Agent, or Firm* — Li & Cai Intellectual Property (USA) Office

(57) ABSTRACT

A light source device with a safety mechanism includes a wavelength converting device and a laser light source configured to provide a laser beam. The wavelength converting device includes a substrate facing toward the laser light source, an optical converting layer disposed on the substrate, and a safety examination layer disposed on one side of the optical converting layer. After the laser beam passes through the safety examination layer, the laser beam enters the optical converting layer. The safety examination layer includes a first conductive film arranged along a first direction and a second conductive film arranged along a second direction. The first conductive film and the second conductive film intersect each other.

9 Claims, 3 Drawing Sheets

LIGHT SOURCE DEVICE WITH SAFETY MECHANISM AND WAVELENGTH CONVERTING DEVICE THEREOF

CROSS-REFERENCE TO RELATED PATENT APPLICATION

This application claims the benefit of priority to Taiwan Patent Application No. 108106779, filed on Feb. 27, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a light source device with a safety mechanism and a wavelength converting device thereof, and more particularly to a light source device with a safety mechanism configured to convert a laser beam into visible light and a wavelength converting device thereof.

BACKGROUND OF THE DISCLOSURE

A conventional light source device generally includes a wavelength converting device and is able to convert a laser beam of light-emitting diodes into visible light. The wavelength converting device includes phosphors to convert the invisible laser beam into the visible light. When the wavelength converting device is damaged, the laser beam will likely penetrate through the wavelength converting device and cause damage to a person's eyes.

SUMMARY OF THE DISCLOSURE

In response to the above-referenced technical inadequacies, the present disclosure provides a light source device with a safety mechanism that is able to determine whether a wavelength converting device of the light source device is damaged and is able to shut off a laser light source of the light source device to prevent damage to a person's eyes, so as to improve on issues associated with a conventional light source device. That is, when a wavelength converting device of a conventional light source device is damaged, a laser beam is likely to penetrate through the wavelength converting device and cause damage to a person's eyes.

In one aspect, the present disclosure provides a wavelength converting device with a safety mechanism configured to convert a laser beam into visible light. The wavelength converting device with the safety mechanism includes a substrate, an optical converting layer, and a safety examination layer. The optical converting layer is disposed on the substrate. The safety examination layer is disposed on one side of the optical converting layer. After the laser beam passes through the safety examination layer, the laser beam enters the optical converting layer. The safety examination layer includes a first conductive film arranged along a first direction and a second conductive film arranged along a second direction. The first conductive film and the second conductive film intersect each other.

In one aspect, the present disclosure provides a light source device with a safety mechanism. The light source device with the safety mechanism includes a laser light source and a wavelength converting device. The laser light source is configured to provide a laser beam. The wavelength converting device includes a substrate, an optical converting layer, and a safety examination layer. The substrate faces toward the laser light source. The optical converting layer is disposed on the substrate. The safety examination layer is disposed on one side of the optical converting layer. After the laser beam passes through the safety examination layer, the laser beam enters the optical converting layer. The safety examination layer includes a first conductive film arranged along a first direction and a second conductive film arranged along a second direction. The first conductive film and the second conductive film intersect each other.

Therefore, the light source device with the safety mechanism of the present disclosure includes the effects as follows. In the present disclosure, a conductive area of the optical converting layer is configured to measure a change of a current value or a resistance value, and when the change is greater than a predetermined value, the laser beam source is shut off to prevent damage to a person's eyes. In addition, the wavelength converting device configured to convert the laser beam into the visible light is able to detect whether a crack has been formed, so as to prevent damage to a person's eyes.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
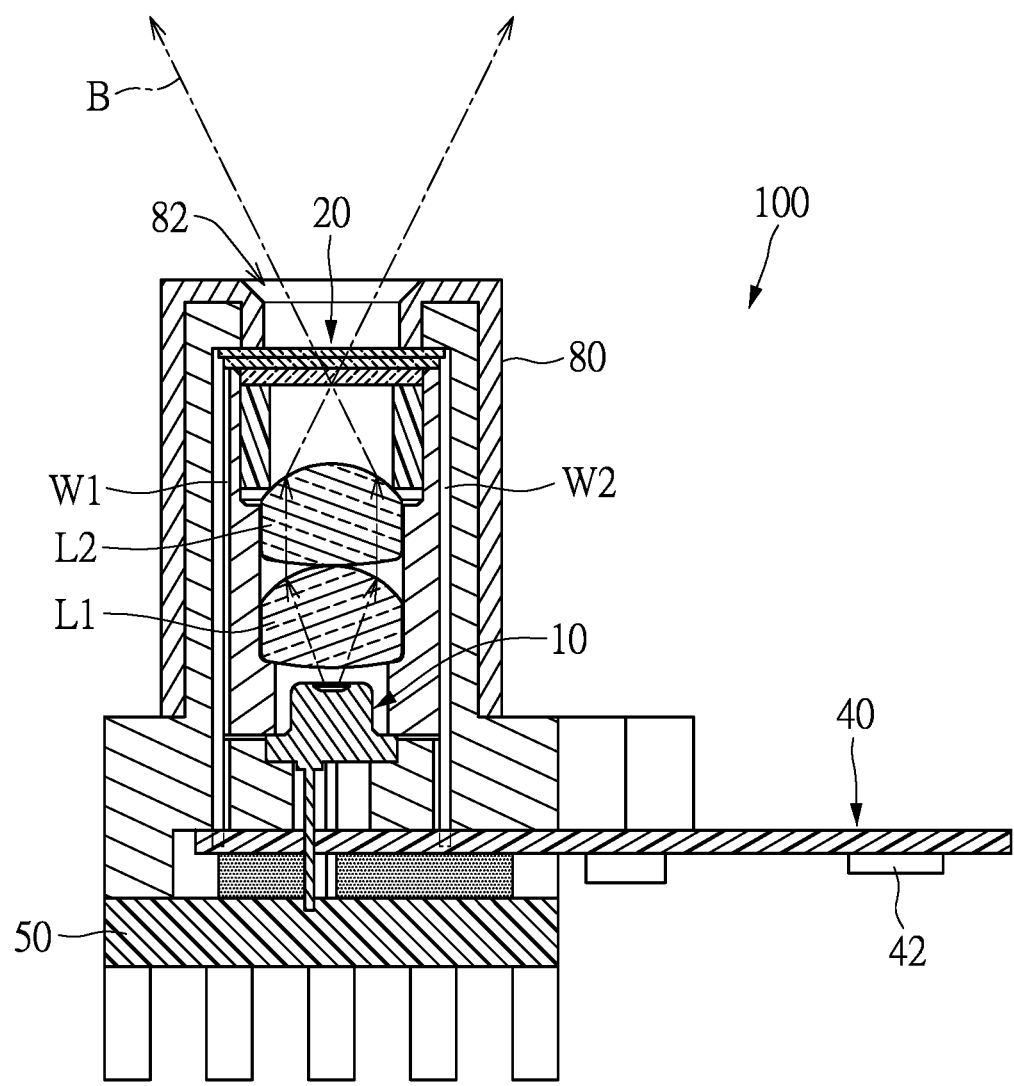
FIG. 1 is a sectional view of a light source device with a safety mechanism of the present disclosure according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
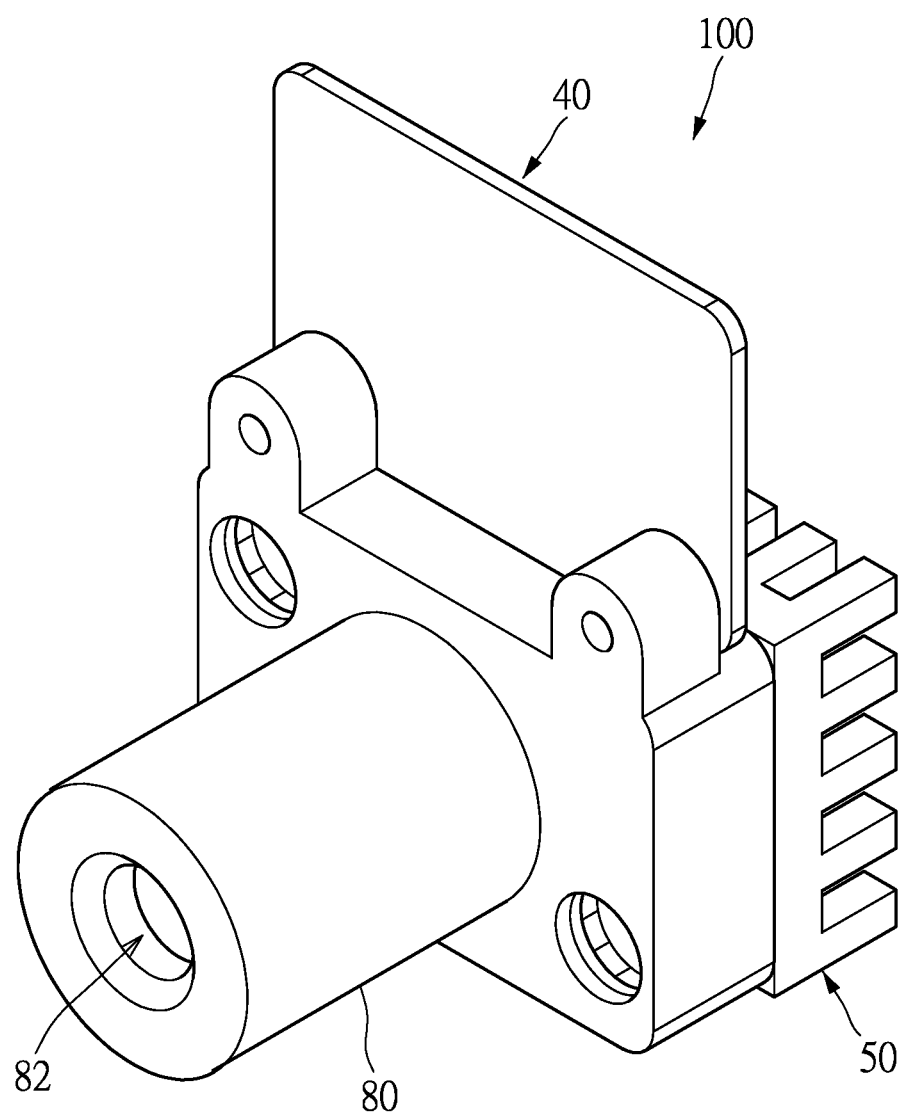
FIG. 2 is a perspective view of the light source device with the safety mechanism of the present disclosure according to the embodiment of the present disclosure.

Referring to FIG. 1 and FIG. 2, FIG. 1 is a sectional view of a light source device with a safety mechanism of the present disclosure according to an embodiment of the present disclosure, and FIG. 2 is a perspective view of the light source device with the safety mechanism of the present disclosure according to the embodiment of the present disclosure. The present disclosure provides a light source device with the safety mechanism 100. The light source device with the safety mechanism 100 includes a laser light source 10 and a wavelength converting device 20. The laser light source 10 and the wavelength converting device 20 are disposed inside of a shell 80. The wavelength converting device 20 includes a substrate 22, an optical converting layer 26, and a safety examination layer 24. The main purpose of the present disclosure is to convert laser light into white light through the optical converting layer 26, and the white light can be an auxiliary light source for vehicle illumination. The laser light source 10 is configured to provide a laser beam B (e.g., a blue laser). The substrate 22 of the wavelength converting device 20 faces toward the laser light source 10 so as to receive the laser beam B. The laser beam B preferably passes through a lens before entering the wavelength converting device 20. In the present embodiment, a first lens L1 and a second lens L2 are disposed between the laser source 10 and the wavelength converting device 20.

In the present embodiment, the substrate 22 includes a diffusion layer 221 and a filter layer 222. The filter layer 222 is disposed on one side of the diffusion layer 221, and the safety examination layer 24 is arranged between the filter layer 222 and the optical converting layer 26. The diffusion layer 221 is able to diffuse the laser beam B. The filter layer 222 is made by stacking a plurality of dielectric films with different refractive indices. The filter layer 222 can allow the laser beam B to pass there-through and can reflect fluorescence generated by the wavelength converting device 20 so that the fluorescence is sufficiently mixed with the laser beam B.

In the present embodiment, a circuit board 40 is disposed at a bottom portion of the shell 80. The laser light source 10 is fixed onto the circuit board 40. The circuit board 40 includes a microprocessor 42. In addition, in the present embodiment, a heat dissipating element 50 is disposed near the circuit board 40. The shell 80 has an opening 82 so that light passes through the opening 82.

The optical converting layer 26 is disposed on the substrate 22. In one embodiment of the present disclosure, the optical converting layer 26 can include phosphors, and the phosphors emit light in the visible spectrum when excited by the laser beam B. For example, the phosphors can utilize Cerium-doped Yttrium-aluminum-garnet (i.e., Ce:YAG) so that the laser beam B or at least one part of the laser beam B is partially converted or is particularly converted into light in the visible spectrum (e.g., yellow light). Converted yellow light and the unconverted blue laser are mixed to form the white light.

Figure 3:
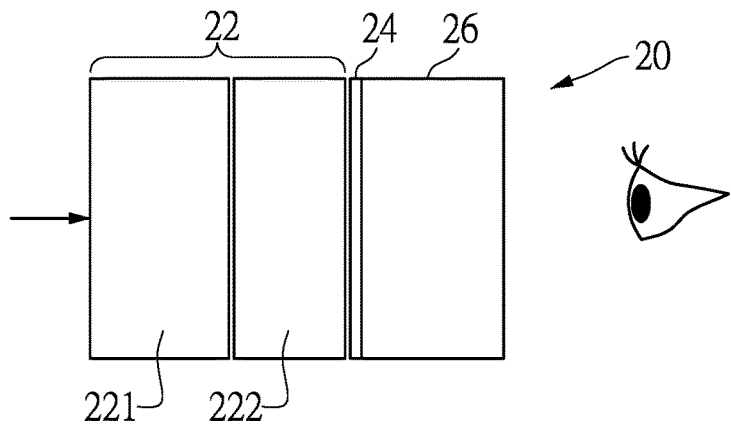
FIG. 3 is a sectional view of a wavelength converting device of the present disclosure according to the embodiment of the present disclosure.
Figure 4:
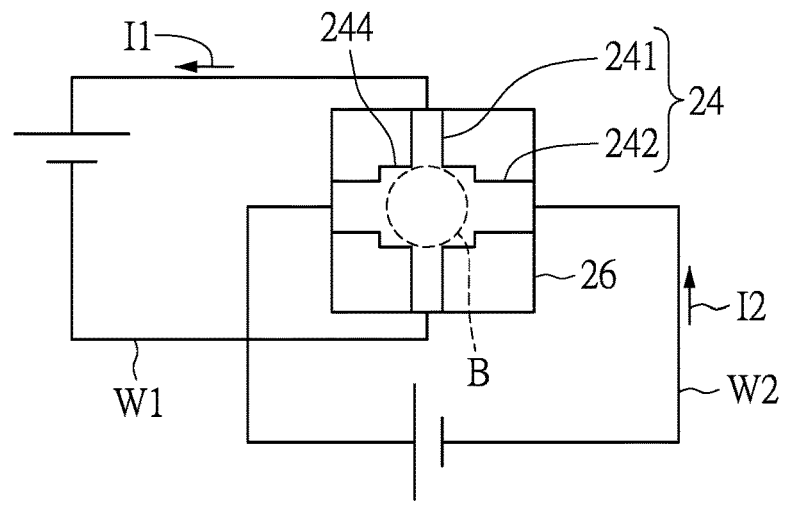
FIG. 4 is a schematic view of a circuit of a safety examination layer of the present disclosure according to the embodiment of the present disclosure.

Referring to FIG. 3 and FIG. 4, one of the features of the present disclosure is that the safety examination layer 24 is disposed on one side of the optical converting layer 26 so that when the optical converting layer 26 cracks, the laser light source 10 can be shut off automatically as a safety mechanism. In the present disclosure, after the laser beam B passes through the safety examination layer 24, the laser beam B enters the optical converting layer 26. The safety examination layer 24 includes a first conductive film 241 arranged along a first direction and a second conductive film 242 arranged along a second direction, and the first conductive film 241 and the second conductive film 242 intersect each other. The first conductive film 241 and the second conductive film 242 are preferably made of transparent conductive materials, such as indium tin oxide (ITO) film or zinc oxide (ZnO) transparent conductive film coated on the optical converting layer 26.

In the present embodiment, the first conductive film 241 and the second conductive film 242 intersect each other to form a cruciform shape. A width of the first conductive film 241 is substantially equal to a width of the second conductive film 242 and is lesser than a light spot diameter of the laser beam B. The safety examination layer 24 includes an enlarged examination area 244 arranged at a position where the first conductive film 241 and the second conductive film 242 intersect each other. A width of the enlarged examination area 244 is greater than the width of the first conductive film 241, and the width of the enlarged examination area 244 is greater than the width of the second conductive film 242. The width of the enlarged examination area 244 is equal to or greater than the light spot diameter of the laser beam B. The enlarged examination area 244 is arranged at a central position of the wavelength converting device 20, and the enlarged examination area 244 entirely covers a light spot area of the laser beam B. The width of the first conductive film 241 can be equal to the width of the second conductive film 242, but the present disclosure is not limited thereto. The width of the first conductive film 241 can be not equal to the width of the second conductive film 242. The first conductive film 241 and the second conductive film 242 are electrically connected to the circuit board 40 respectively through a circuit W1 and a circuit W2.

The microprocessor 42 is configured to measure and compare a current value I1 generated by a current flowing through the first conductive film 241 and a current value I2 generated by the current flowing through the second conductive film 242, or a resistance value R1 of the first conductive film 241 and a resistance value R2 of the second conductive film. When a surface of the optical converting film 26 is damaged, the resistance value R1 of the first conductive film 241 and the resistance value R2 of the second conductive film 242 change, and particularly, increase. The current value I1 and the current value I2 respectively generated by the current flowing through the first conductive film 241 and the second conductive film 242 decrease when the resistance value R1 and the resistance value R2 increase. The microprocessor 42 is disposed on the circuit board 40.

The light source device with the safety mechanism 100 of the present disclosure can be provided with a predetermined testing value. For example, when a measured current value (i.e., the current value I1 or the current value I2) is less than 80% of an initial current value, the microprocessor 42 shuts off the laser light source 10. The initial current value refers to a current value generated by the current flowing through the first conductive film 241 and the second conductive film 242 in an initial state, and in the initial state, the first conductive film 241 and the second conductive film 242 are not damaged. Or, when a measured resistance value (i.e., the resistance value R1 or the resistance value R2) is greater than 120% of an initial resistance value, the microprocessor 42 shuts off the laser light source 10. The initial resistance value refers to a resistance value of the first conductive film 241 and the second conductive film 242 in the initial state. When the surface of the optical converting layer 26 is damaged, it is possible that only a crack is formed, and the crack does not penetrate through (i.e., to the other side surface of) the optical converting layer 26. In other words, the laser beam B still does not leak through the optical converting layer 26. Therefore, since the optical converting layer 26 has a conductive area in a cruciform shape so as to measure a change of the current or the resistance, when the change is greater than a predetermined value, the laser light source 10 is shut off.

Figure 5:
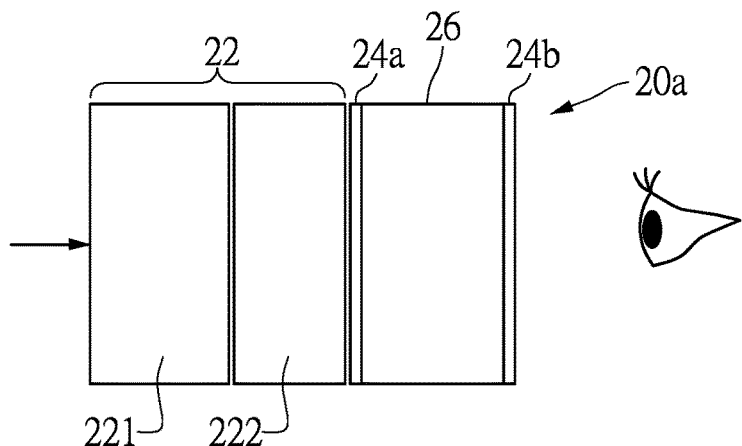
FIG. 5 is a sectional view of the safety examination layer of the present disclosure according to another embodiment of the present disclosure.

Referring to FIG. 5, FIG. 5 is a sectional view of the safety examination layer of the present disclosure according to another embodiment of the present disclosure. In the present embodiment, a wavelength converting device 20a with a safety mechanism is provided. The difference between the present embodiment and the previous embodiment is that a first conductive film 24a and a second conductive film 24b are respectively disposed on two sides of the optical converting layer 26. The enlarged examination area 244 can be disposed on one side of the two sides, and the first conductive film 24a or the second conductive film 24b is partially enlarged to form the enlarged examination area 24a. Or, a width of the first conductive film 24a or a width of the second conductive film 24b can be equal to the width of the enlarged examination area 244 of the previous embodiment (i.e., greater than or equal to the light spot diameter of the laser beam B).

Therefore, whether the wavelength converting device 20 is damaged can be detected so that the laser light source 10 can be shut off under a predetermined condition to prevent damage to a person's eyes. Through the conductive area in a cruciform shape of the present disclosure, the change of the current or the resistance can be measured, and when the change is greater than a predetermined value, the laser light source 10 is shut off. When the surface of the optical converting layer 26 is damaged, the optical converting layer 26 can still be used, and an illumination function of the light source device with the safety mechanism 100 is not immediately affected. At this time, the microprocessor 42 can preferably issue a safety warning to remind users that the light source device with the safety mechanism 100 should be examined or changed.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A wavelength converting device with a safety mechanism, configured to convert a laser beam into visible light, comprising:
    a substrate;
    an optical converting layer disposed on the substrate; and
    a safety examination layer disposed on one side of the optical converting layer, wherein after the laser beam passes through the safety examination layer, the laser beam enters the optical converting layer, wherein the safety examination layer includes a first conductive film arranged along a first direction and a second conductive film arranged along a second direction, and wherein the first conductive film and the second conductive film intersect each other;
    wherein the substrate includes a diffusion layer and a filter layer, the filter layer is disposed on one side of the diffusion layer, and the safety examination layer is arranged between the filter layer and the optical converting layer.

2. The wavelength converting device according to claim 1, wherein a width of the first conductive film equals a width of the second conductive film.

3. The wavelength converting device according to claim 1, wherein the first conductive film and the second conductive film are made of transparent conductive materials.

4. The wavelength converting device according to claim 1, wherein the safety examination layer includes an enlarged examination area, and the enlarged examination area is arranged at a position where the first conductive film and the second conductive film intersect each other, and wherein a width of the enlarged examination area is greater than a width of the first conductive film, and the width of the enlarged examination area is greater than a width of the second conductive film.

5. The wavelength converting device according to claim 4, wherein the enlarged examination area is arranged at a central position of the wavelength converting device, and the enlarged examination area entirely covers a light spot area of the laser beam.

6. The wavelength converting device according to claim 4, wherein the first conductive film and the second conductive film are respectively disposed on two sides of the optical converting layer, and the enlarged examination area is disposed on one side of the two sides of the optical converting layer.

7. A light source device with a safety mechanism, comprising:
    a laser light source configured to provide a laser beam; and
    a wavelength converting device, wherein the wavelength converting device includes:
        a substrate facing toward the laser light source;
        an optical converting layer disposed on the substrate; and a safety examination layer disposed on one side of the optical converting layer, wherein after the laser beam passes through the safety examination layer, the laser beam enters the optical converting layer, wherein the safety examination layer includes a first conductive film arranged along a first direction and a second conductive film arranged along a second direction, and wherein the first conductive film and the second conductive film intersect each other;

wherein the substrate includes a diffusion layer and a filter layer, the filter layer is disposed on one side of the diffusion layer, and the safety examination layer is arranged between the filter layer and the optical converting layer.

8. The light source device according to claim 7, further comprising a microprocessor configured to measure and compare a current value generated by a current flowing through the first conductive film and a current value generated by the current flowing through the second conductive film, or a resistance value of the first conductive film and a resistance value of the second conductive film.

9. The light source device according to claim 8, wherein when a measured current value is less than 80% of an initial current value, the microprocessor shuts off the laser light source, or when a measured resistance value is greater than 120% of an initial resistance value, the microprocessor shuts off the laser light source.

* * * * *